(12) United States Patent
Lo et al.

(10) Patent No.: US 8,976,329 B2
(45) Date of Patent: Mar. 10, 2015

(54) ARRAY SUBSTRATE AND LCD PANEL

(75) Inventors: Shih-Hsun Lo, Guandong (CN); Shyh-Feng Chen, Guandong (CN); Bing Han, Guandong (CN)

(73) Assignee: Shenzhen China Star Optoelectronics Technology co. Ltd., Shenzhen, Guangdong (CN)

( * ) Notice: Subject to any disclaimer, the term of this patent is extended or adjusted under 35 U.S.C. 154(b) by 175 days.

(21) Appl. No.: 13/640,935

(22) PCT Filed: Aug. 10, 2012

(86) PCT No.: PCT/CN2012/079905
§ 371 (c)(1),
(2), (4) Date: Oct. 12, 2012

(87) PCT Pub. No.: WO2014/023010
PCT Pub. Date: Feb. 13, 2014

(65) Prior Publication Data
US 2014/0043553 A1 Feb. 13, 2014

(30) Foreign Application Priority Data
Aug. 7, 2012 (CN) .......................... 2012 1 0278666

(51) Int. Cl.
G02F 1/1343 (2006.01)
G02F 1/1362 (2006.01)
H01L 27/15 (2006.01)

(52) U.S. Cl.
CPC ........ G02F 1/136286 (2013.01); H01L 27/156 (2013.01); *G02F 1/134309* (2013.01); *G02F 2201/40* (2013.01)
USPC .............................. 349/143; 349/43; 349/110

(58) Field of Classification Search
None
See application file for complete search history.

(56) References Cited

U.S. PATENT DOCUMENTS

| 7,167,218 B1* | 1/2007 | Park et al. ........................ 349/44 |
| 8,253,890 B2* | 8/2012 | Zhong et al. .................. 349/106 |
| 2002/0175887 A1* | 11/2002 | Yamazaki ........................ 345/87 |

* cited by examiner

*Primary Examiner* — Richard Kim
(74) *Attorney, Agent, or Firm* — Andrew C. Cheng

(57) ABSTRACT

The present invention discloses an array substrate, comprising: multiple pixel units arranged in an array having rows and columns, and each of the pixel units comprises a pixel electrode, and the pixel electrode comprises at least a trunk portion corresponding to an opaque dark area; and multiple scan lines, and each of the scan lines is disposed within the vertical projection of the trunk portion for inputting a scanning signal to one of the pixel units. The present invention also discloses an LCD panel. By the above way, the present invention can improve the transmittance and the aperture ratio of the LCD panel.

17 Claims, 4 Drawing Sheets

ARRAY SUBSTRATE AND LCD PANEL

BACKGROUND OF THE INVENTION

1. Field of the Invention

The present invention relates to the liquid crystal display (LCD) field, and more particularly to an array substrate and an LCD panel.

2. Description of Related Art

HVA wide viewing angle technology is one of the VA wide viewing angle technologies. Through adding light-sensitive monomer molecules in liquid crystal molecules and applying an electric signal to the liquid crystal molecules, it makes the liquid crystal molecules have pre-tilt angles. Then, it applies an ultraviolet light irradiation at the liquid crystal molecules to cure the pre-tilt angles. By the above photo-alignment method with the electric signal, it achieves curing the liquid crystal molecules above the surface of an alignment film (PI, Polyimide) with certain pre-tilt angles to omit conventional friction orientation structure.

With reference to FIG. 1 and FIG. 2, in order to achieve wide viewing angle in HVA-type display panel, it is typically designed a pixel electrode 1 having multi-domain structure and the shape of the structure is similar to "*" as shown in FIG. 1 for four-domain structure. Specifically, please refer to FIG. 2 shown the specific schematic view of a pixel structure. The pixel electrode 1 includes trunk electrodes 11 and branch electrodes 12, wherein the trunk electrodes 11 are located at the junction of the branch electrodes 12 of the various areas. In the arrangement of RGB sub pixels of the display panel of HVA type, the three RGB sub pixels are replaced from the traditional horizontal arrangement to longitudinally arrangement. Therefore, scan line 2 is located at the long side of the pixel electrode 1 and between the adjacent pixel electrodes 1. However, due to the factors such as line width and the resistance of the scan line 2, it will occupy more space by locating the scan line 2 at the long side of the pixel electrode 1. Thereby reducing the aperture ratio of the LCD panel, and reducing the brightness of the LCD panel.

SUMMARY OF THE INVENTION

The main technical problem solved by the present invention is to provide an array substrate and a liquid crystal display (LCD) panel to improve the transmittance and the aperture ratio of the LCD panel.

In order to solve the above-mentioned technical problem, a technical solution provided by the present invention is: an array substrate comprising: multiple pixel units arranged in an array having rows and columns, and each of the pixel units comprises a pixel electrode and a color resist layer, and the pixel electrode comprises at least a trunk portion corresponding to an opaque dark area; and multiple scan lines, and each of the scan lines is disposed within the vertical projection of the trunk portion for inputting a scanning signal to one of the pixel units;

wherein, the color resist layer is located between the trunk portion and the scan line; the array substrate comprises a display area, and the multiple pixel units are divided into first pixel units and second pixel units, and the first pixel units are located in the display area, and the second pixel units are located outside the display area and adjacent to the edge of the display area, and at least one of the scan lines is disposed within the vertical projection of the trunk portion of the opaque dark area corresponding to the second pixel units.

Wherein, each of the pixel units has a long side and a short side, and the long side is parallel to a row direction, and the short side is parallel to a column direction, and each of the scan lines is parallel to the long side.

Wherein, the array substrate comprises multiple data lines and multiple thin film transistors, and each of the data lines is parallel to the short side of the pixel unit for inputting a data signal to one of the pixel unit; each of the thin film transistors comprises a gate electrode, a source electrode, and a drain electrode, and the gate electrode is electrically connected to the scan line, and the source electrode is electrically connected to the data line, and the drain electrode is electrically connected to the pixel electrode.

In order to solve the above-mentioned technical problem, another technical solution provided by the present invention is: an array substrate comprising:

multiple pixel units arranged in an array having rows and columns, and each of the pixel units comprises a pixel electrode, and the pixel electrode comprises at least a trunk portion corresponding to an opaque dark area; and multiple scan lines, and each of the scan lines is disposed within the vertical projection of the trunk portion for inputting a scanning signal to one of the pixel units.

Wherein, each of the pixel units has a long side and a short side, and the long side is parallel to a row direction, and the short side is parallel to a column direction, and each of the scan lines is parallel to the long side.

Wherein, the array substrate comprises multiple data lines and multiple thin film transistors, and each of the data lines is parallel to the short side of the pixel unit for inputting a data signal to one of the pixel units; each of the thin film transistors comprises a gate electrode, a source electrode, and a drain electrode, and the gate electrode is electrically connected to the scan line, and the source electrode is electrically connected to the data line, and the drain electrode is electrically connected to the pixel electrode.

Wherein, each of the data lines respectively inputs the data signal to all of the pixel units of a pixel unit column through the corresponding thin film transistors.

Wherein, one of the data lines respectively inputs the data signal to some of the pixel units of two columns adjacent to the one of the data lines through the corresponding thin film transistors.

Wherein, the array substrate comprises a display area, and the multiple pixel units are divided into first pixel units and second pixel units, and the first pixel units are located in the display area, and the second pixel units are located outside the display area and adjacent to the edge of the display area, and at least one of the scan lines is disposed within the vertical projection of the trunk portion of the opaque dark area corresponding to the second pixel units.

Wherein, each of the pixel units further comprises a color resist layer, and the color resist layer is located between the trunk portion of the pixel electrode corresponding to the opaque dark area and the scan line.

In order to solve the above-mentioned technical problem, another technical solution provided by the present invention is: an LCD panel comprising: an array substrate, a color filter substrate, and a liquid crystal layer disposed between the array substrate and the color filter substrate, wherein, the array substrate comprises:

multiple pixel units arranged in an array having rows and columns, and each of the pixel units comprises a pixel electrode, and the pixel electrode comprises at least a trunk portion corresponding to an opaque dark area; and multiple scan lines, and each of the scan lines is disposed within the vertical projection of the trunk portion for inputting a scanning signal to one of the pixel units.

Wherein, each of the pixel units has a long side and a short side, and the long side is parallel to a row direction, and the short side is parallel to a column direction, and each of the scan lines is parallel to the long side.

Wherein, the array substrate comprises multiple data lines and multiple thin film transistors, and each of the data lines is parallel to the short side of the pixel unit for inputting a data signal to one of the pixel units; each of the thin film transistors comprises a gate electrode, a source electrode, and a drain electrode, and the gate electrode is electrically connected to the scan line, and the source electrode is electrically connected to the data line, and the drain electrode is electrically connected to the pixel electrode.

Wherein, each of the data lines respectively inputs the data signal to all of the pixel units of a pixel unit column through the corresponding thin film transistors.

Wherein, one of the data lines respectively inputs the data signal to some of the pixel units of two columns adjacent to the one of the data lines through the corresponding thin film transistors.

Wherein, the array substrate comprises a display area, and the multiple pixel units are divided into first pixel units and second pixel units, and the first pixel units are located in the display area, and the second pixel units are located outside the display area and adjacent to the edge of the display area, and at least one of the scan lines is disposed within the vertical projection of the trunk portion of the opaque dark area corresponding to the second pixel units.

Wherein, each of the pixel units further comprises a color resist layer, and the color resist layer is located between the trunk portion of the pixel electrode corresponding to the opaque dark area and the scan line.

The beneficial effects of the present invention are: comparing with the prior art, in the array substrate of the present invention, each of the pixel electrodes of the pixel units comprises a trunk portion corresponding to an opaque dark area. Through disposing the scan line within the vertical projection of the trunk portion instead of disposing it at the region between the two pixel units, the pixel electrode can expand to the space between the two pixel units such that the area using for original scan line become a transmittance area. Accordingly, it improves the transmittance and the aperture ratio of the LCD panel.

DETAILED DESCRIPTION OF THE PREFERRED EMBODIMENT

The following content combines figures and embodiments for detail description of the present invention.

Figure 1:
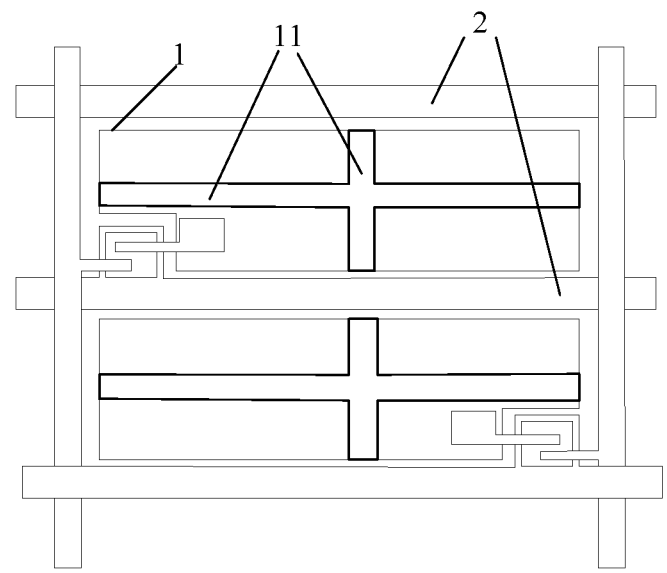
FIG. 1 is a schematic plan view of the pixel structure of an array substrate of the prior art.
Figure 2:
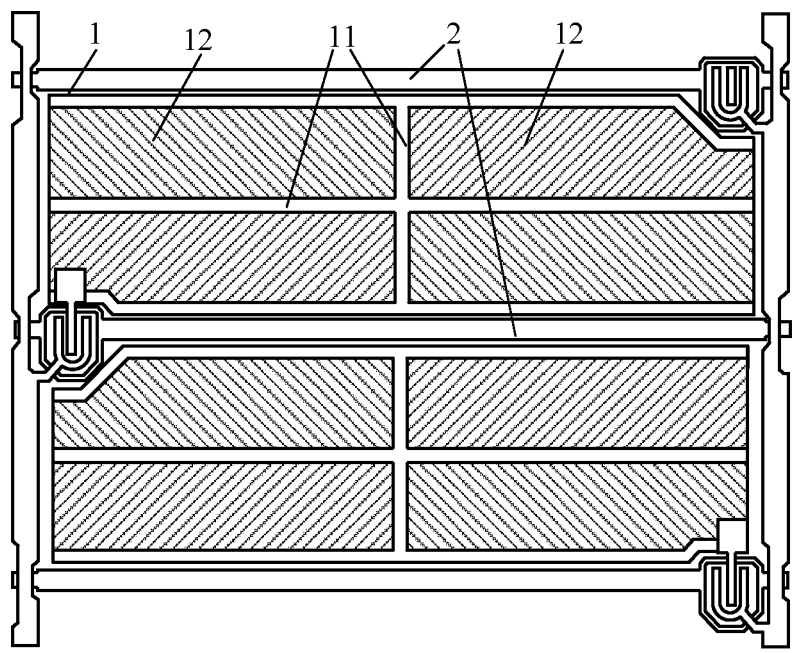
FIG. 2 is a schematic structural view of the pixel electrode in FIG. 1.
Figure 3:
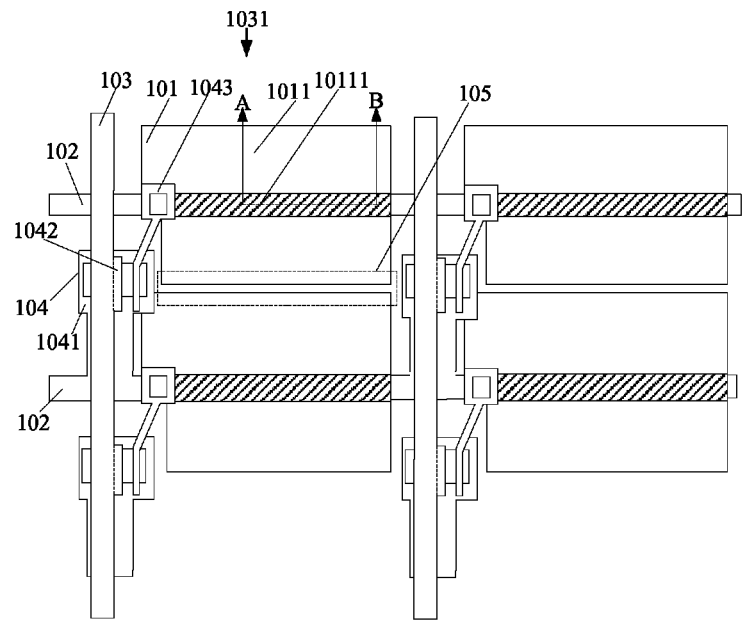
FIG. 3 is a schematic plan view of an embodiment of the array substrate of the present invention.

With reference to FIG. 3, an embodiment of an array substrate of the present invention comprises: multiple pixel units 101 and multiple scan lines 102 arranged in an array having rows and columns Wherein each of the pixel units 101 includes a pixel electrode 1011, and the pixel electrode 1011 includes at least a trunk portion 10111 corresponding to an opaque dark area (not shown). The scan line 102 is disposed within the vertical projection of the trunk portion 10111 for input scanning signal to the pixel unit 101.

The HVA-type LCD panel uses ITO (Indium Tin Oxide) cracks partitions to form multiple liquid crystal tilt domains. Through applying different electrical signals and UV irradiation to the different liquid crystal tilt domains, the liquid crystal molecules in the different liquid crystal tilt domains have different pre-tilt angles. The liquid crystal molecules having different tilts form the opaque dark areas at the junction locations of the different liquid crystal tilt domains. The trunk portion 10111 of the pixel electrode 1011 is corresponding to the opaque dark area. The scan line 102 is located below the pixel electrode 1011 and disposed within the vertical projection of the trunk portion 10111 of the pixel electrode 1011.

Wherein, each of the pixel units 101 has a long side and a short side. The long side is parallel to the row direction of the arrangement of the pixel units 101, and the short side is parallel to the column direction of the arrangement of the pixel units 101. In the present embodiment, the scan line 102 is parallel to the long side.

Furthermore, the array substrate includes multiple data lines 103 and multiple thin film transistors 104. Each of the data lines 103 is parallel to the short side of the pixel unit 101 for inputting a data signal to the pixel unit 101. Each of the thin film transistors 104 includes a gate electrode 1041, a source electrode 1042, and a drain electrode 1043. Wherein, the gate electrode 1041 is electrically connected to the scan line 102, and the source electrode 1042 is electrically connected to the data line 103, and the drain electrode 1043 is electrically connected to the pixel electrode 1011. When it is required to display a screen, the scan line 102 inputs the scanning signal to the gate electrode 1041 of the thin film transistor 104 to turn on the thin film transistor 104. Then, the data line 103 inputs the data signal to the source electrode 1042, and the data signal passing through the drain electrode 1043 to the pixel electrode 1011 to display the screen.

In the present embodiment, one of the data lines 103 corresponds to a pixel unit column 1031, and each of the pixel units 101 corresponds to one of the thin film transistors 104. Each of the data lines 103 inputs the data signal respectively to the pixel units 101 of the pixel unit column 1031 through the corresponding thin film transistors 104.

On the array substrate of the present embodiment, the trunk portion 10111 of the pixel electrode 1011 is corresponding to the opaque dark area. It fully uses the space corresponding to the opaque dark area, and the scan lines 102 is arranged within the vertical projection of the trunk portion 10111 rather than arranging at a region 105 between the two pixel units 101 so that the pixel electrode 1011 can expand to the space between the two pixel units 101. Therefore, it increases the transmittance area of the pixel unit 101. Thereby, it improves the transmittance and the aperture ratio of the LCD panel so as to increase the brightness of the LCD panel.

Figure 4:
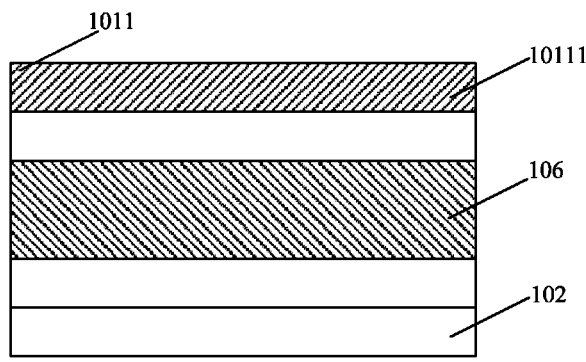
FIG. 4 is a schematic cross-sectional view of the pixel unit of FIG. 3 along the AB direction.

In addition, with also reference to FIG. 4, the pixel unit 101 of the present embodiment further comprises a color resist layer 106. The color resist layer 106 is located between the corresponding trunk portion 10111 of the pixel electrode 1011 corresponding to the opaque dark area (not shown) and the scan line 102. Adding the color resist layer 106 between the pixel electrode 1011 and the scan line 102 make the distance between the pixel electrode 1011 and the scan line 102 become larger so that it effectively reduces the capacitive load of the scan line 102 in order to reduce the color shift and improve the display effect.

Figure 5:
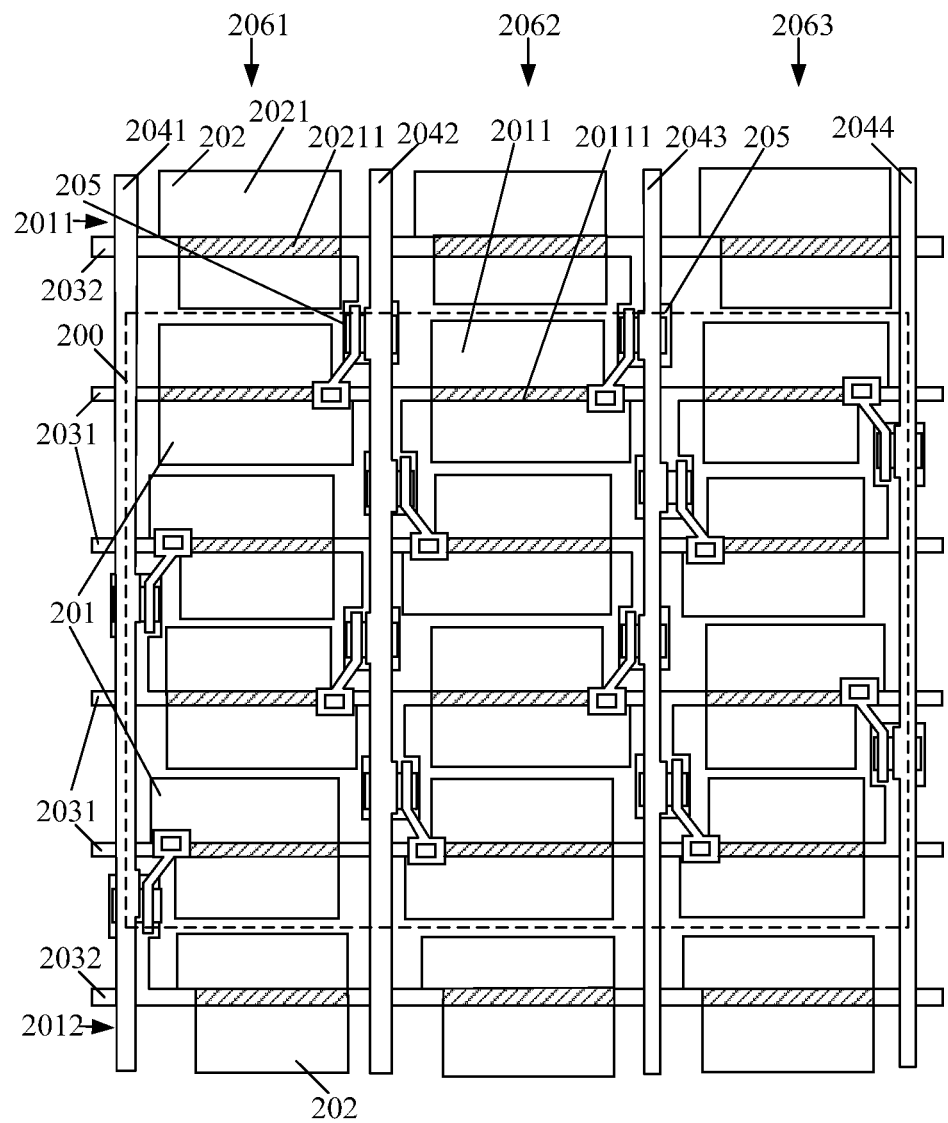
FIG. 5 is a schematic plan view of another embodiment of the array substrate of the present invention.

With reference to FIG. 5, in another embodiment of the array substrate of the present invention, the array substrate includes a display area 200 (shown in a dashed frame), and the multiple pixel units are divided into first pixel units 201 and second pixel units 202. As shown in FIG. 5, the first pixel units 201 are located in the display area 200 of the array substrate for displaying the screen, and the second pixel units 202 are located outside the display area 200 and adjacent to the edge of the display area 200. In other words, the pixel units of a first row 2011 and the pixel units of an end row 2012 are the second pixel units 202.

In the multiple scan lines of the array substrate, second scan line 2032 is arranged within the vertical projection of a trunk portion 20211 of a pixel electrode 2021 of the second pixel units 202, and first scan line 2031 is arranged within the vertical projection of a trunk portion 20111 of a pixel electrode 2011 of the first pixel units 201. The second pixel units 202 are not used for display, and are defined as "false" pixel units for auxiliary pixel units. Their structures are the same as the structure of the first pixel units 201. The arrangement of the second pixel units 202 make the second scan line 2032 locate within the vertical projection range of the trunk portion 20211 of the pixel electrode 2021. Therefore, all the scan lines of the array substrate could be arranged in the same structures, and the consistence of the structures can improve the uniformity of the brightness and the chrominance of the LCD panel.

The data lines of the array substrate of the present embodiment can make one of the data lines input the data signal to the pixel units of different columns Specifically, in the multiple data lines, it includes a first to a fourth data lines 2041-2044. Wherein, the second data line 2042 respectively inputs the data signal to some of the first pixel units 201 of a first pixel unit column 2061 adjacent to the second data line 2042 and some of the first pixel units 201 of a second pixel unit column 2062 adjacent to the second data line 2042 through the corresponding thin film transistors 205

The third data line 2043 respectively inputs the data signal to some of the first pixel units 201 of a second pixel unit column 2062 adjacent to the third data line 2043 and some of the first pixel units 201 of a third pixel unit column 2063 adjacent to the third data line 2043 through the corresponding thin film transistors 205.

While the first data line 2041 and the fourth data line 2044 input the data signal to the other first pixel units 201 of the first pixel unit column 2061 and the third pixel unit column 2063. Through the above way, the second data line 2042 and the third data line 2043 respectively input the data signal to the pixel units of the two columns adjacent to them through the corresponding thin film transistors 205, reducing the energy consumption of the data lines.

Figure 6:
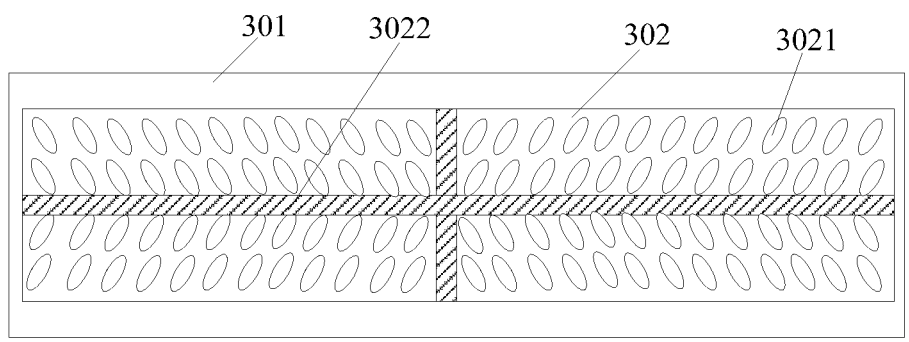
FIG. 6 is a schematic plan view of another embodiment of the LCD panel of the present invention, not shown the color filter substrate.

In order to solve the above technical problems, the present invention also provides an embodiment of the LCD panel. Specifically, with reference to FIG. 6, an embodiment of the present invention LCD panel includes: an array substrate 301, a color filter substrate (not shown), and a liquid crystal layer 302 located between the array substrate 301 and the color filter substrate.

Wherein, the LCD panel corresponding to the display area of each of the pixel units comprises at least an opaque dark area. In order to achieve wide viewing angle of the LCD panel, the liquid crystal layer 302 is divided into multiple liquid crystal tilt domains. In the different LCD tilt domains, the tilt directions of the liquid crystal molecules 3021 are different such that the opacity dark area 3022 is formed at the junction location of the different liquid crystal tilt domains. Therefore, in the LCD panel, the display area of each of the pixel units comprises the opaque dark area.

Wherein, the array substrate 301 is the array substrate of each of the embodiments described above. The array substrate shown in FIG. 3 is for an example. The array substrate includes multiple pixels units 101 and scan lines 102 arranged in an array having rows and columns. Each of the pixel units 101 includes a pixel electrode 1011, and the pixel unit 101 has a long side and a short side. The long side is parallel to the row direction, and the short side is parallel to the column direction. In the pixel electrode 1011, at least one trunk portion 10111 corresponds to the opaque dark area 3022 of the liquid crystal layer 302. The scan line 102 is disposed within the vertical projection of the trunk portion 10111 of the pixel electrode 1011, and is parallel to the direction of the long side of the pixel unit 101 so as to input scanning signal to the pixel unit 101.

Furthermore, the array substrate further comprises multiple data lines 103 and multiple thin film transistors 104. Each of the data line 103 is parallel to the short side of the pixel unit 101 to input data signal. The thin film transistor 104 includes a gate electrode 1041, a source electrode 1042, and a drain electrode 1043. One of the pixel units 101 correspondingly connects to one of the scan lines, one of the data lines, and one of the thin film transistors.

Wherein the gate electrode 1041 of the thin film transistor 104 corresponding to one of the pixel units 101 electrically connects to the corresponding scan line 102; the source electrode 1042 electrically connects to the corresponding data line 103; the drain electrode 1043 electrically connects to the corresponding pixel electrode 1011.

When it is required to display a screen, respectively inputting the corresponding electric signal to the scan line 102 and the data line 103 to make the pixel electrode 1011 display the corresponding screen.

In the LCD panel of the present embodiment, disposing the scan line 102 within the vertical projection of the trunk portion 10111 of the pixel electrode 1011 instead of disposing it at the region 105 between the two pixel units 101 so that the pixel electrode 1011 can expand to the space between the two pixel units 101, increasing the transmittance area of the pixel unit 101. Accordingly, it improves the transmittance and the aperture ratio of the LCD panel so as to increase the brightness of the LCD panel.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:
1. An array substrate comprising:
multiple pixel units arranged in an array having rows and columns, and each of the pixel units comprises a pixel electrode and a color resist layer, and the pixel electrode comprises at least a trunk portion corresponding to an opaque dark area of a liquid crystal layer, wherein, for each pixel unit, the liquid crystal layer is divided into multiple liquid crystal tilt domains, and the opaque dark area is formed at a junction location of the liquid crystal tilt domains; and
multiple scan lines, and each of the scan lines is disposed within the vertical projection of the trunk portion for inputting a scanning signal to one of the pixel units, wherein each scan line does not arrange at a region between two pixel units;

wherein, the color resist layer is located between the trunk portion and the scan line; the array substrate comprises a display area, and the multiple pixel units are divided into first pixel units and second pixel units, and the first pixel units are located in the display area, and the second pixel units are located outside the display area and adjacent to the edge of the display area, and at least one of the scan lines is disposed within the vertical projection of the trunk portion of the opaque dark area corresponding to the second pixel units.

2. The array substrate according to claim 1, wherein, each of the pixel units has a long side and a short side, and the long side is parallel to a row direction, and the short side is parallel to a column direction, and each of the scan lines is parallel to the long side.

3. The array substrate according to claim 2, wherein, the array substrate comprises multiple data lines and multiple thin film transistors, and each of the data lines is parallel to the short side of the pixel unit for inputting a data signal to one of the pixel unit; each of the thin film transistors comprises a gate electrode, a source electrode, and a drain electrode, and the gate electrode is electrically connected to the scan line, and the source electrode is electrically connected to the data line, and the drain electrode is electrically connected to the pixel electrode.

4. An array substrate comprising:
multiple pixel units arranged in an array having rows and columns, and each of the pixel units comprises a pixel electrode, and the pixel electrode comprises at least a trunk portion corresponding to an opaque dark area of a liquid crystal layer, wherein, for each pixel unit, the liquid crystal layer is divided into multiple liquid crystal tilt domains, and the opaque dark area is formed at a junction location of the liquid crystal tilt domains; and
multiple scan lines, and each of the scan lines is disposed within the vertical projection of the trunk portion for inputting a scanning signal to one of the pixel units, wherein each scan line does not arrange at a region between two pixel units.

5. The array substrate according to claim 4, wherein, each of the pixel units has a long side and a short side, and the long side is parallel to a row direction, and the short side is parallel to a column direction, and each of the scan lines is parallel to the long side.

6. The array substrate according to claim 5, wherein, the array substrate comprises multiple data lines and multiple thin film transistors, and each of the data lines is parallel to the short side of the pixel unit for inputting a data signal to one of the pixel units; each of the thin film transistors comprises a gate electrode, a source electrode, and a drain electrode, and the gate electrode is electrically connected to the scan line, and the source electrode is electrically connected to the data line, and the drain electrode is electrically connected to the pixel electrode.

7. The array substrate according to claim 6, wherein, each of the data lines respectively inputs the data signal to all of the pixel units of a pixel unit column through the corresponding thin film transistors.

8. The array substrate according to claim 6, wherein, one of the data lines respectively inputs the data signal to some of the pixel units of two columns adjacent to the one of the data lines through the corresponding thin film transistors.

9. The array substrate according to claim 6, wherein, one of the data lines respectively inputs the data signal to some of the pixel units of two columns adjacent to the one of the data lines through the corresponding thin film transistors.

10. The array substrate according to claim 6, wherein, each of the pixel units further comprises a color resist layer, and the color resist layer is located between the trunk portion of the pixel electrode corresponding to the opaque dark area and the scan line.

11. An LCD panel comprising:
an array substrate, a color filter substrate, and a liquid crystal layer disposed between the array substrate and the color filter substrate, wherein, the array substrate comprises:
multiple pixel units arranged in an array having rows and columns, and each of the pixel units comprises a pixel electrode, and the pixel electrode comprises at least a trunk portion corresponding to an opaque dark area of the liquid crystal layer, wherein, for each pixel unit, the liquid crystal layer is divided into multiple liquid crystal tilt domains, and the opaque dark area is formed at a junction location of the liquid crystal tilt domains; and
multiple scan lines, and each of the scan lines is disposed within the vertical projection of the trunk portion for inputting a scanning signal to one of the pixel units, wherein each scan line does not arrange at a region between two pixel units.

12. The LCD panel according to claim 11, wherein, each of the pixel units has a long side and a short side, and the long side is parallel to a row direction, and the short side is parallel to a column direction, and each of the scan lines is parallel to the long side.

13. The LCD panel according to claim 12, wherein, the array substrate comprises multiple data lines and multiple thin film transistors, and each of the data lines is parallel to the short side of the pixel unit for inputting a data signal to one of the pixel units; each of the thin film transistors comprises a gate electrode, a source electrode, and a drain electrode, and the gate electrode is electrically connected to the scan line, and the source electrode is electrically connected to the data line, and the drain electrode is electrically connected to the pixel electrode.

14. The LCD panel according to claim 13, wherein, each of the data lines respectively inputs the data signal to the entire pixel units of a pixel unit column through the corresponding thin film transistors.

15. The LCD panel according to claim 13, wherein, one of the data lines respectively inputs the data signal to some of the pixel units of two columns adjacent to the one of the data lines through the corresponding thin film transistors.

16. The LCD panel according to claim 13, wherein, each of the pixel units further comprises a color resist layer, and the color resist layer is located between the trunk portion of the pixel electrode corresponding to the opaque dark area and the scan line.

17. The LCD panel according to claim 13, wherein, the array substrate comprises a display area, and the multiple pixel units are divided into first pixel units and second pixel units, and the first pixel units are located in the display area, and the second pixel units are located outside the display area and adjacent to the edge of the display area, and at least one of the scan lines is disposed within the vertical projection of the trunk portion of the opaque dark area corresponding to the second pixel units.

\* \* \* \* \*